US006195893B1

(12) United States Patent
Kataoka

(10) Patent No.: US 6,195,893 B1
(45) Date of Patent: Mar. 6, 2001

(54) METHOD OF MANUFACTURE OF HEAT EXCHANGE UNIT

(76) Inventor: Tetsuji Kataoka, 36-3 Nishifunatsu, Fuji-shi, Shizouka-ken (JP)

( * ) Notice: Subject to any disclaimer, the term of this patent is extended or adjusted under 35 U.S.C. 154(b) by 0 days.

(21) Appl. No.: 09/057,943

(22) Filed: Apr. 9, 1998

(30) Foreign Application Priority Data

Apr. 11, 1997 (JP) .................................................. 9-110369

(51) Int. Cl.[7] .................................................. B23P 6/00
(52) U.S. Cl. ................................. 29/890.032; 29/890.03; 29/557
(58) Field of Search ........................ 29/890.03, 890.032, 29/557; 165/104.33

(56) References Cited

U.S. PATENT DOCUMENTS

| 5,419,041 | * | 5/1995 | Ozeki ................................. 29/890.03 |
| 5,428,897 | * | 7/1995 | Jordan et al. ...................... 29/890.03 |
| 5,572,789 | * | 11/1996 | Fisher et al. ...................... 29/890.03 |
| 5,638,715 | * | 6/1997 | Lipinski ............................ 29/890.03 |
| 5,711,069 | * | 1/1998 | Hundt .............................. 29/890.03 |
| 5,758,418 | * | 6/1998 | Chrysler et al. .................. 29/890.03 |

FOREIGN PATENT DOCUMENTS

| 1989-27736 | 1/1989 | (JP) . |
| 1989-264296 | 10/1989 | (JP) . |
| 1989-266922 | 10/1989 | (JP) . |
| 1992-313687 | 11/1992 | (JP) . |

* cited by examiner

Primary Examiner—I Cuda Rosenbaum
(74) Attorney, Agent, or Firm—Lyon & Lyon LLP

(57) ABSTRACT

A heat exchange unit and the method of its manufacture including a base plate with heat dissipating protrusions extending therefrom which are formed by plastic deformation. One or more long holes extend through the base plate to receive heat pipes in conductive contact. The long hole is formed during the extrusion of billets from which the units are formed. Mandrels are placed in the long holes through the billets and the heat exchange unit is formed therefrom. The mandrel is then extracted and replaced by a heat pipe. Further deformation of the base plate around the inserted heat pipe can insure intimate contact for heat conduction between components.

5 Claims, 8 Drawing Sheets

Fig. 4A
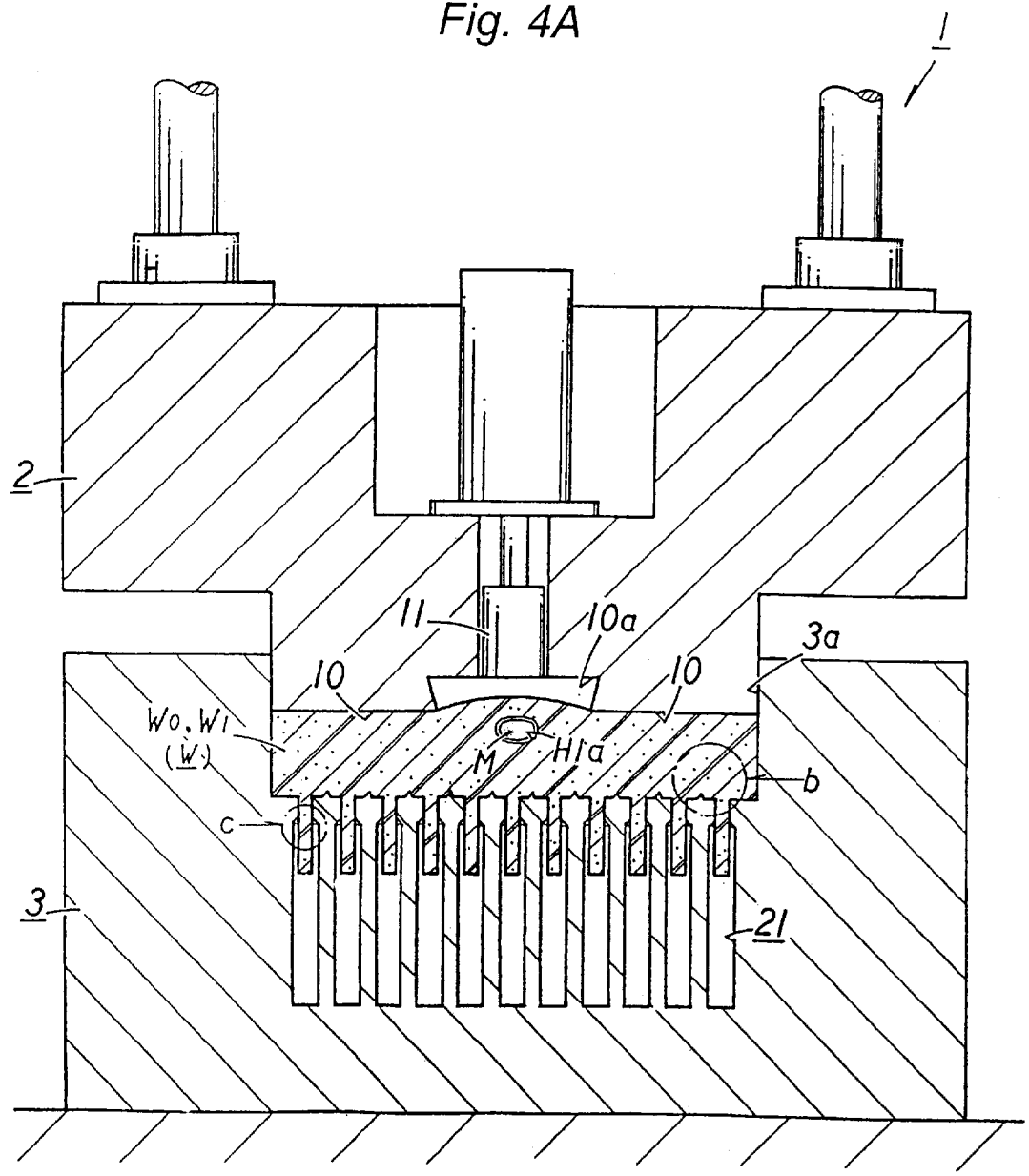
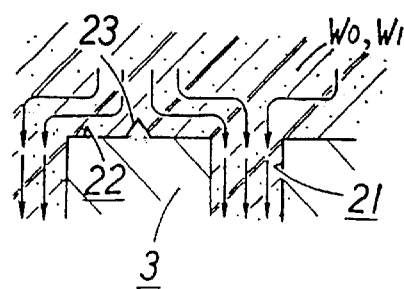
Fig. 4B    Fig. 4C

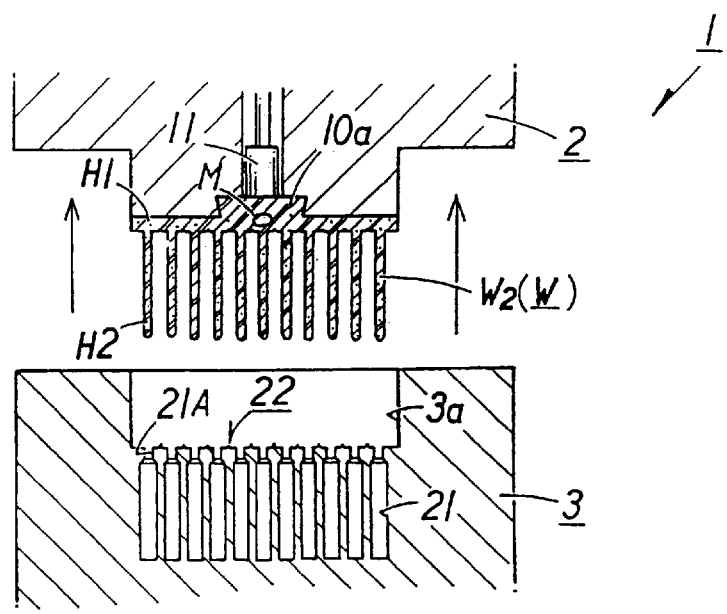
Fig. 8A
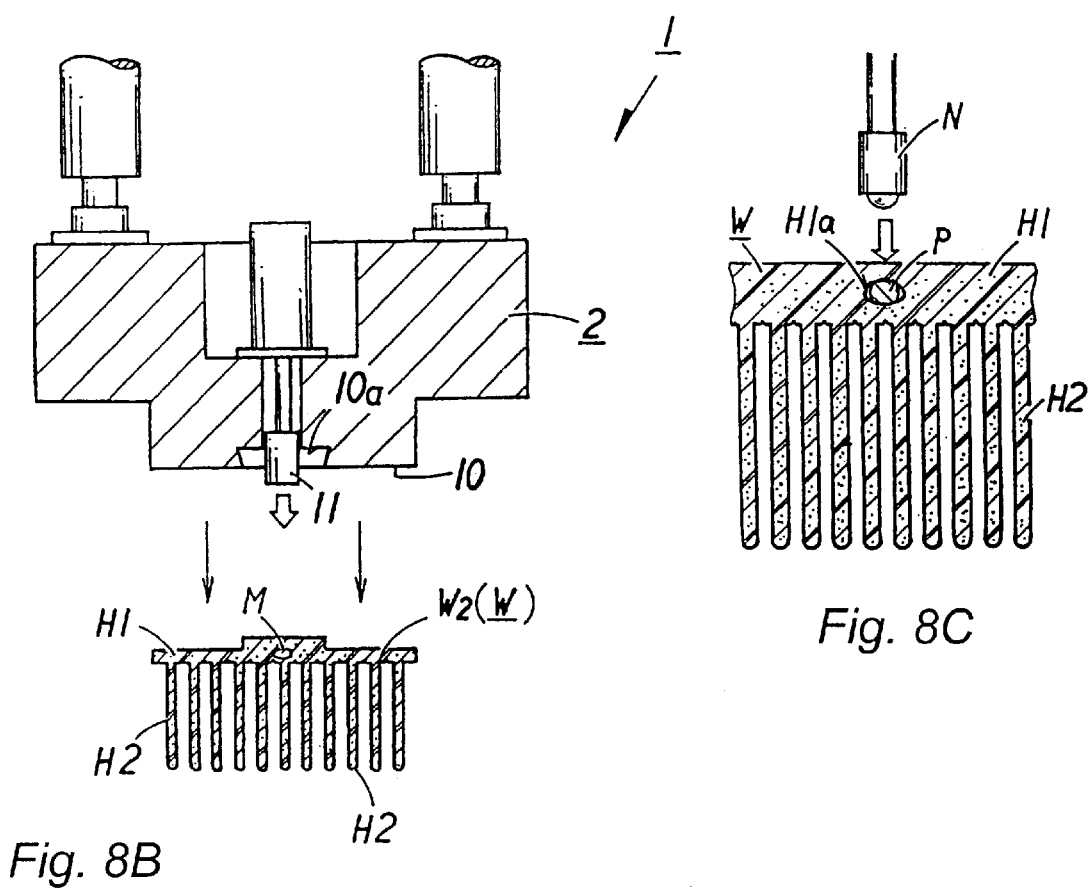
Fig. 8B
Fig. 8C

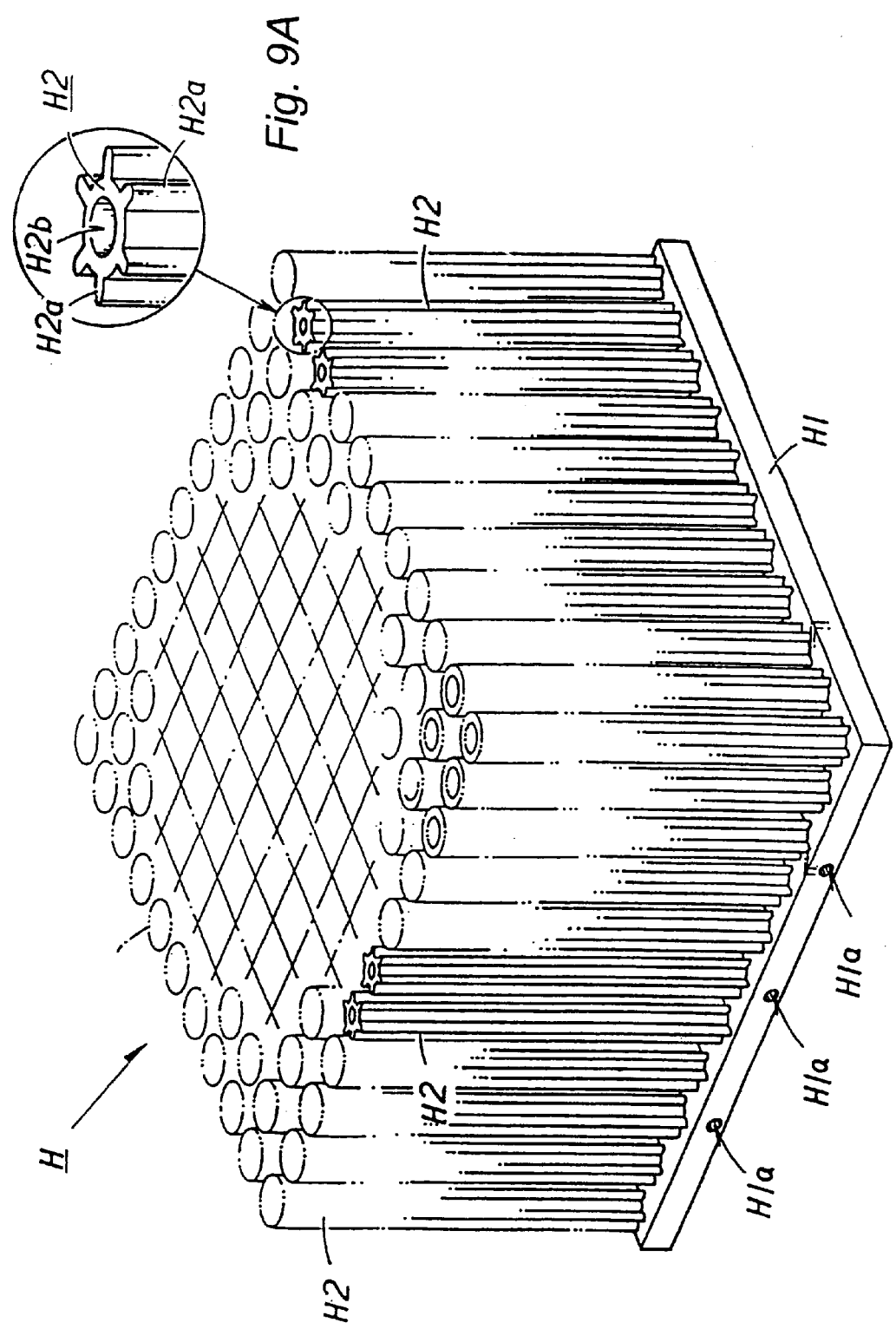

METHOD OF MANUFACTURE OF HEAT EXCHANGE UNIT

BACKGROUND OF THE INVENTION

The field of the present invention is heat exchange components.

A number of heat exchanging components have been developed for the dissipation of heat from electronic components. Reference is made to Japanese Patent Publications 1989-27736; 1989-264296; 1989-266922 and 1992-313687, the disclosures of which are incorporated herein by reference. These disclosures describe heat dissipation items with multiple numbers of pin-shaped protrusions formed generally through plastic deformation from a base plate unit. The disclosed devices have significant heat dissipation properties. However, when used with electronic components additional heat dissipation is needed as the integrated density of the electronic components increases. This can be true even if cooling air is forced through the inside of the component case. Even though the components may become better able to transfer heat, the overall system may not become more efficient.

Heat pipes have been known for creating more efficient transfer. Attempts have been made to integrate such heat pipe structures with heat exchange components. However, the formation of long holes to receive the heat pipes has been problematic. Conical point drilling is difficult, provides low productivity and creates a cavity not conducive for heat transfer to inserted heat pipes. Conical point cutting marks from the drills leave helical lines in the peripheral wall which can negatively impact heat transfer. Further, the fit of the heat pipe element within such a hole typically leaves significant areas without direct contact. Again, heat transfer efficiency is reduced. Finally, drills are only able to create cylindrical holes of circular cross section.

SUMMARY OF THE INVENTION

The present invention is directed to the provision of heat exchange units having long holes able to accommodate heat pipes in the base plates of such units. Smooth peripheral surfaces of the holes and an appropriate fit with an inserted heat pipe are contemplated as the result of the method of forming that structure.

In a first separate aspect of the present invention, base plates and heat dissipating protrusions of a heat exchange unit are formed through plastic deformation of a metal billet. Mandrels are placed in long holes within the billet prior to plastic deformation and are removed after such deformation. Holes of relatively small diameter to length are able to be formed with varying cross-sectional shapes and orientations. A mirror surface can be obtained based on the surface precision of the mandrels.

In a second separate aspect of the present invention, the method of the first aspect is enhanced through the thermal expansion of the base plate prior to extraction of the mandrels.

In a third separate aspect of the present invention, the insertion of heat pipes into the long holes created by the method contemplated in the first separate aspect is enhanced through the deformation of the base plate to compress each long hole against each heat pipe for improved heat conduction.

Accordingly, it is an object of the present invention to provide a new method of manufacture of a new heat exchange component where precise long holes are formed through the base plate simultaneously with the forming process of the component through plastic deformation. Other and further objects and advantages will appear hereinafter.

BRIEF DESCRIPTION OF THE DRAWINGS

FIG. 1A is a final stage of plastic deformation with the die illustrated in cross section.

FIG. 1B is a perspective view of the unit with the mandrel removed.

FIG. 4A is the formation of a unit with the dies illustrated in cross section.

FIG. 4B is a detail of the view in FIG. 4A showing the flow of material.

FIG. 4C illustrates a detail of the die with the die in cross section.

FIGS. 8a–c illustrates the progressive formation of the heat exchange unit beyond removal from the die.

FIG. 9 is a perspective view of an alternate embodiment of a heat exchange unit.

DETAILED DESCRIPTION OF THE PREFERRED EMBODIMENTS

In the following, heat exchange units having long holes in the base plates thereof and the method of manufacturing of such units are explained. A metal billet $W_0$ will be shown to be worked into a interim phase piece $W_1$ and finally into a product piece $W_2$ through the use of a die unit 1. The heat exchange units H formed by the die unit 1 are shown each to have a base plate H1 and heat dissipating protrusions H2 leveled off by cutting after removal from the die. Surface treatment such as alumite or plating may be appropriately used as well.

Figure 1:
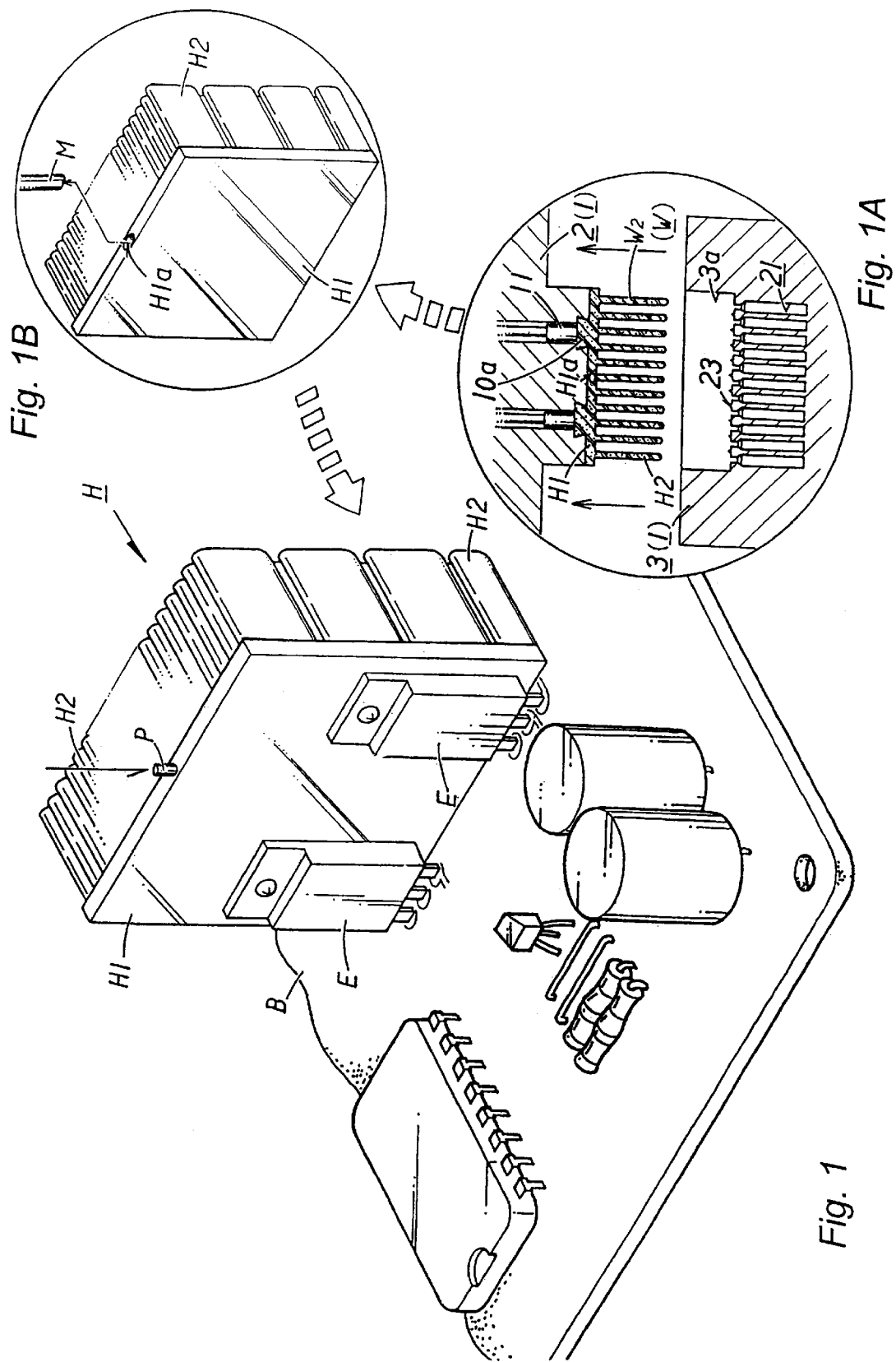
FIG. 1 is a perspective view of a heat exchange unit in use.

FIG. 1 illustrates a heat exchange unit H having a base plate H1 mounted above the top of a printed circuit board B. Electronic components E, which generate heat, are supported by the base plate H1. The electronic components E are cooled by the heat exchange unit H.

Figure 2:
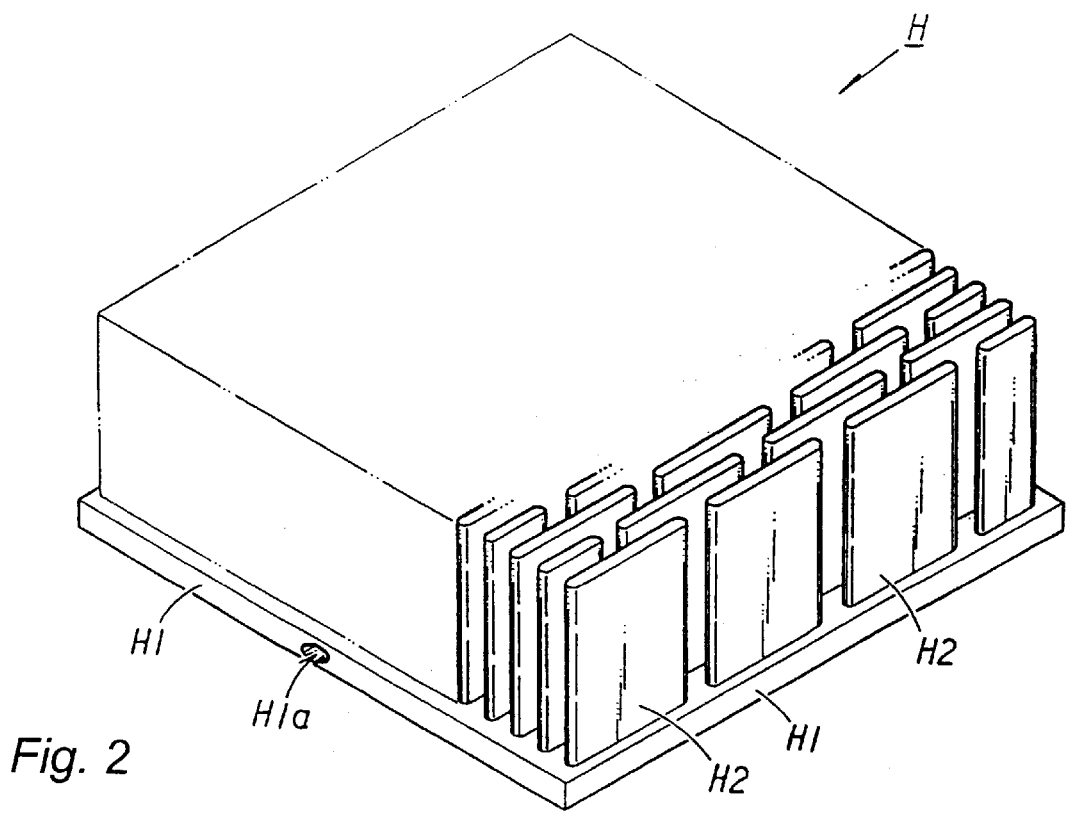
FIG. 2 is a perspective view of a unit with the mandrel removed.
Figure 3:
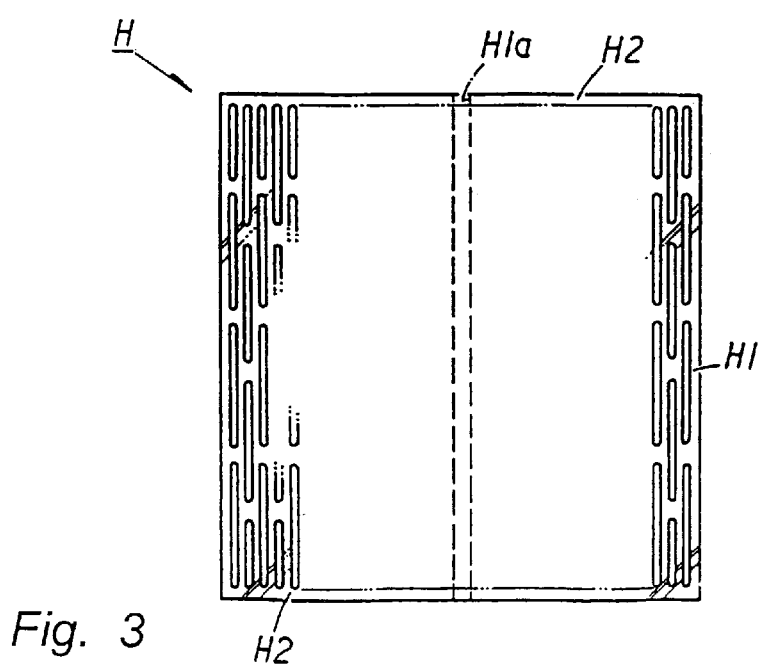
FIG. 3 is a plan view of the unit of FIG. 2.

In FIGS. 2 and 3, the heat exchange unit H is shown to have a base plate H1 with multiple flat plate-shaped heat dissipating protrusions H2 extending from the rectangular base plate H1. The heat dissipating protrusions H2 are formed by plastic deformation to stand perpendicularly to the base plate. The unit H is comprised of metallic material most principally consisting of aluminum which has an extremely high heat dissipation effect in association with the electronic components E with the surface area of heat dissipating protrusions H2 having many times the surface area of the base plate H1.

One or more long holes H1a are located in the base plate H1. The long holes H1a are formed through the base plate H1 and lie perpendicular to the heat dissipating protrusions H2. With the heat dissipating protrusions H2 formed with the base plate H1, the long hole H1a illustrated in FIG. 2 is at the stage for receipt of a heat pipe. One or more heat pipes associated with one or more long holes H1a, respectively, accelerate heat exchange further beyond that provided by the heat dissipating protrusions H2. The number of heat pipes employed depends on the anticipated heat load generated by the electronic components E.

The heat pipe P, as illustrated in FIG. 1, may be employed to increase heat transfer between the heat generating area and the dissipating protrusions H2. This heat transfer is enhanced when the long hole H1a and the heat pipe P are in mutual contact. Rather than a heat pipe P, it is also contemplated that gaseous or liquid cooling medium may flow through the long hole H1a to increase heat exchange. With such fluid cooling, it is appropriate to supplement the cooling system by a cooling medium supply unit to actively cause flow through the long holes H1a.

FIG. 4 illustrates the die unit 1 employed for manufacturing the heat exchange units. The die unit 1 includes a punch die 2 which deforms the initial blank piece or metal billet $W_0$ and forming die 3 which forms the heat dissipating protrusions H2 as the punch die 2 presses the billet $W_0$. The forming die 3 has a recessed receiving area 3a which receives the billet $W_0$. A multiple number of forming cavities 21 extend from the base of the receiving area 3a. The forming die is preferably formed without seams through the manufacture of the die as one unit or through the assembly of a number of blocks without clearance.

The forming cavities 21 as better illustrated in FIG. 4C and as partially illustrated in FIG. 4A each include a restricting area 21A and a widened area 21B. The restricting area 21A is used to establish the thickness of the flat plate-shaped heat dissipating protrusions H2 which may then extend upon formation into the relieved area 21B. The shape of the restricting area 21A may accommodate any appropriate shape for defining the protrusions H2 of the heat exchange unit H. FIG. 4B illustrates the detail of the pressing surface 22 between the cavities 21. Separation ribs 23 are shown formed on the pressing surface 22. These ribs 23 are intended to assist the billet W to flow uniformly into each forming cavity 21. By providing the separation ribs 23, the heat dissipating protrusions H2 can be more uniform and there is less resistance to flow.

Figure 5:
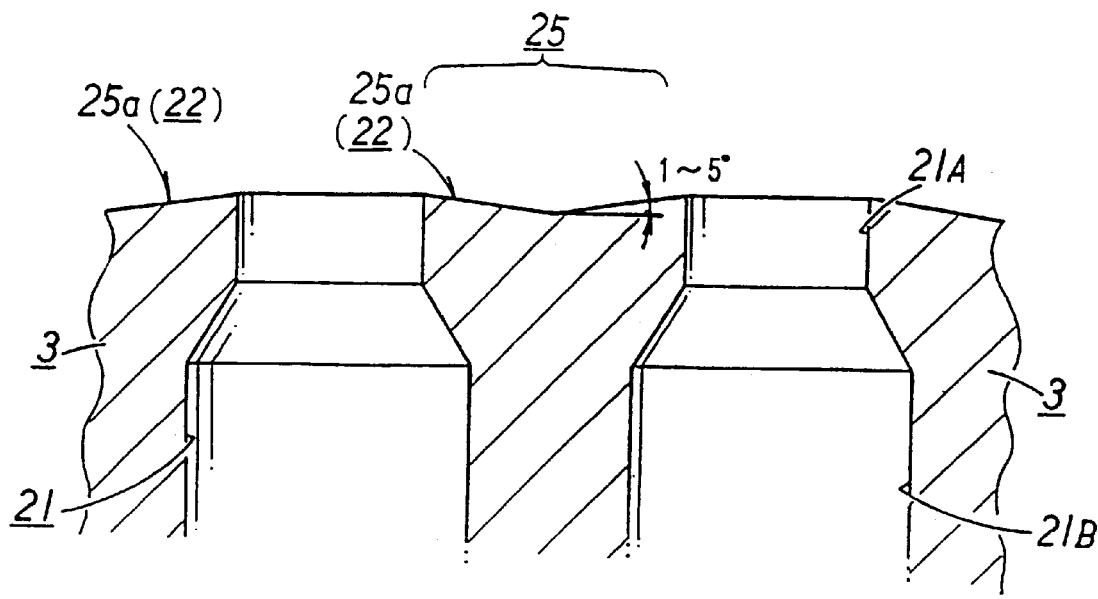
FIG. 5 is an alternate die configuration illustrated in cross section.

In some applications it is contemplated that lubricating material applied to the surface of the unformed billet $W_0$ would flow initially with the work piece and be depleted from the forming die 3 before the heat exchange unit is fully formed. This can prevent smooth forming. In this instance, guiding grooves 25 can be employed as illustrated in FIG. 5. The grooves 25 separate the forming cavities 21 where they are formed on the pressing surface 22 at the peripheral edges of the forming cavities 21. A slope as illustrated of each guiding surface 25a of the groove 25 is arranged to be within 1° to 5°. With the guiding groove 25 formed in this way, the flow of lubricant is made more uniform so as not to exhaust the lubricant before the forming is completed. The lubricating material must climb up along the angled surface 25a to gradually feed into the forming cavity 21 along with the flow of metal. Where extremely long heat dissipating protrusions H2 are formed, this arrangement provides a more uniform forming process, performed smoothly along the length of the heat dissipating protrusion H2.

Returning to FIG. 4, the punch die 2 is inserted into the receiving area 3a of the forming die 3 with an initial billet $W_0$ in place. Pressure is exerted to force part of the billet $W_0$ into the forming cavities 21. Dovetail groove-shaped recessed holding areas 10a are cut into the punch contact area 10 of the die 2. As the billet $W_0$ is reformed, material fills the recessed holding area 10a such that the formed work piece $W_2$ can be held after forming. This feature avoids the need for supplemental chucking equipment for the ejection of the formed piece $W_2$ from the forming die 3. To then eject the held product piece $W_2$ from the punch die 2, a knockout pin 11 can operatively extend into the recessed holding area 10a through the use of a cylinder. Any appropriate shape may be contemplated which has a reverse tapered shape to retain the piece $W_2$. A multiple number of such recessed holding areas 10a may also be contemplated as illustrated in FIG. 1A.

Figure 6:
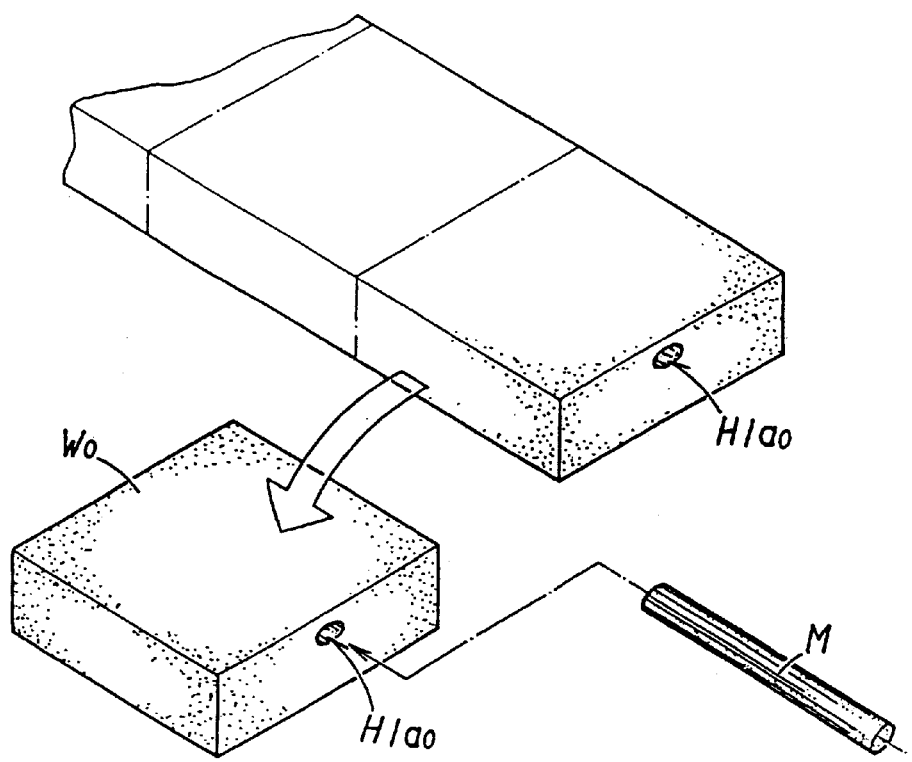
FIG. 6 is a perspective view of the formation of a metal billet and of a mandrel.

The billet $W_0$ is formed from a flat plate-shaped or block-shaped metallic piece having an original long hole $H1a_0$ as illustrated in FIG. 6. The blank is extruded with the hole formed through the extrusion process. The billets may be cut as indicated in FIG. 6. It is unnecessary to form the original long hole $H1a_0$ with great accuracy. Consequently the formation of the hole falls within the capability of a typical extrusion. As an example, the original long hole $H1a_0$ may be formed at about 4.5 mm. in diameter. Upon completion, the long hole H1a will be approximately 3 mm. in diameter. Even though the long hole is contemplated to be formed during extrusion of the blank from which the billets $W_0$ are cut, the long holes $H1a_0$ may be cut after extrusion.

Figure 7A:
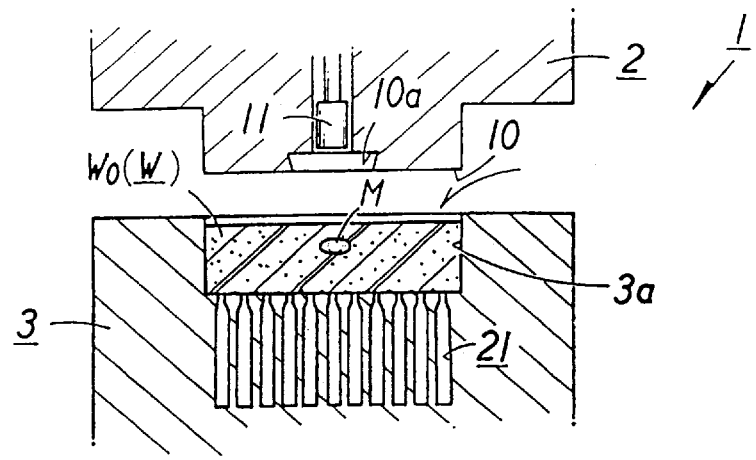
FIGS. 7a–c illustrates the progressive formation of a heat exchange unit with the dies in cross section.
Figure 7B:
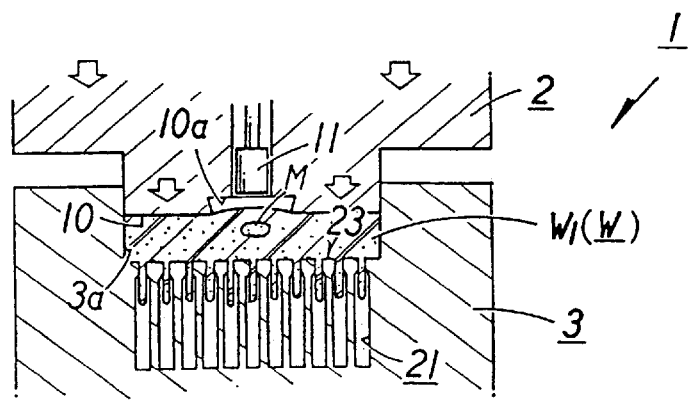

Once the blank $W_0$ is cut, a mandrel M having a preselected cross-sectional shape in contemplation of a heat pipe is inserted into the original long hole $H1a_0$ as seen in FIG. 6. The assembly of the billet $W_0$ and the mandrel M positioned in the original long hole $H1a_0$ is then placed in the receiving area 3a of the forming die 3 as shown in FIG. 7A. The punch die 2 is then driven into the receiving area 3a where it presses against the billet $W_0$. As the billet is compressed, material begins to flow into the cavities 21 and an interim phase piece $W_1$ takes shape as illustrated in FIG. 7B. Without seams and with appropriate lubricating material, the original billet $W_0$ is able to smoothly transition to the interim piece $W_1$ with the forming protrusions H2 and the developing base plate H1. The heights of the protrusions H2 are maintained relatively equal through such a smooth transition. The uniformity is also enhanced by the separate ribs 23 at the peripheral edge of the forming cavities 21. As the billet is compressed through the interim stage $W_1$, the original long hole $H1a_0$ is compressed to become tightly positioned about the mandrel M.

Figure 7C:
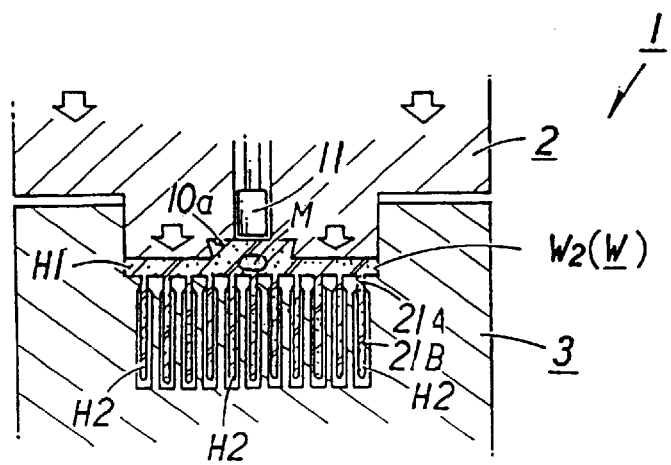

The interim piece $W_1$ is continued to be formed by the die unit 1 such that the heat dissipating protrusions H2 extend further through the restricting area 21A. The base plate H1 is also formed while the dovetail interlocking portion is developed in the recessed holding area 10a. The piece, more completely defined as $W_2$, is illustrated in FIG. 7C. As the cavities 21B are wider than the restricted area 21A, resistance does not increase. The pressure and stroke of the punch die 2 is such that it avoids the extension of the heat dissipating protrusions H2 to the bottom of the cavities 21B in the forming die 3.

Once the product piece $W_2$ is formed through the compression of the die unit 1, the punch die 2 can be pulled upwardly as shown in FIG. 8A. Because the product piece $W_2$ has also formed into the recessed holding area 10a, the product piece $W_2$ will remain with the punch die 2 and be drawn from the forming die 3. This extraction pulls the heat dissipating protrusions H2 through the restricting area 21A with a smooth low resistance release. Once released, a knockout pin 11 is forced downwardly against the product piece $W_2$ for release from the punch die as seen in FIG. 8B.

Once released from the die, the product piece $W_2$ may be finished through additional operations. The long hole H1$a$ has been formed through deformation to a smaller shape than the original long hole H1$a_0$ through the forming process. As the long hole H1$a$ has been restricted in its compression by the mandrel M, it has assumed substantially the cross-sectional shape of the mandrel M. Typically the mandrel M is tightly held within the long hole H1$a$ requiring that the mandrel be removed by pressing it out using a second mandrel with a slightly reduced cross section. It may also be advantageous to heat the product piece $W_2$ for thermal expansion to ease the extraction of the mandrel M. If the long hole H1$a$ is relatively short, heating may be an unnecessary step. The protruding holding boss which was formed by the punch die 2 into the recessed holding area 10$a$ may be removed at this stage if removal is necessary from an operational standpoint. The heat dissipating protrusions H2 may also be machined such that they are level. Surface treatment such as alumite or plating may also be applied.

Once the product piece $W_2$ has been thus formed, a heat pipe P can be inserted into the completed long hole H1$a$. In order to increase the ability to transfer heat from the product piece $W_2$ to the heat pipe P, the base plate H1 may be further formed using a tamping element N to compress the long hole H1$a$ against the heat pipe P.

Other configurations are also illustrated to show the variety of heat exchange units which may be formed. The shape of the base plate H1 may take on any desired shape, e.g. circle, polygon or irregular form. The base plate H1 need not be flat either. Bent and other appropriate three-dimensional shapes may be advantageously formed. The shape of the heat dissipating protrusions H2 may be other than as illustrated in FIG. 2. Cylinders, rectangles and rounded oblong shapes are possible. FIG. 9 illustrates heat dissipating protrusions H2 in a cylinder shape with fins H2$a$ with a center core H2$b$. To achieve the core openings H2$b$, standing pins placed inside the forming cavities 21 of the forming die 3 can be used to achieve this result. The heat exchange unit H is also shown in FIG. 9 to have multiple long holes H1$a$.

Variations are possible with the cross section of the long holes H1$a$. The shapes are restricted to the cross-sectional shapes of the mandrel M which may take on a variety of shapes compatible with the heat pipes P such as polygons, ovals, deformed circles such as formed by squashing a part of a circle, etc.

Figure 10:
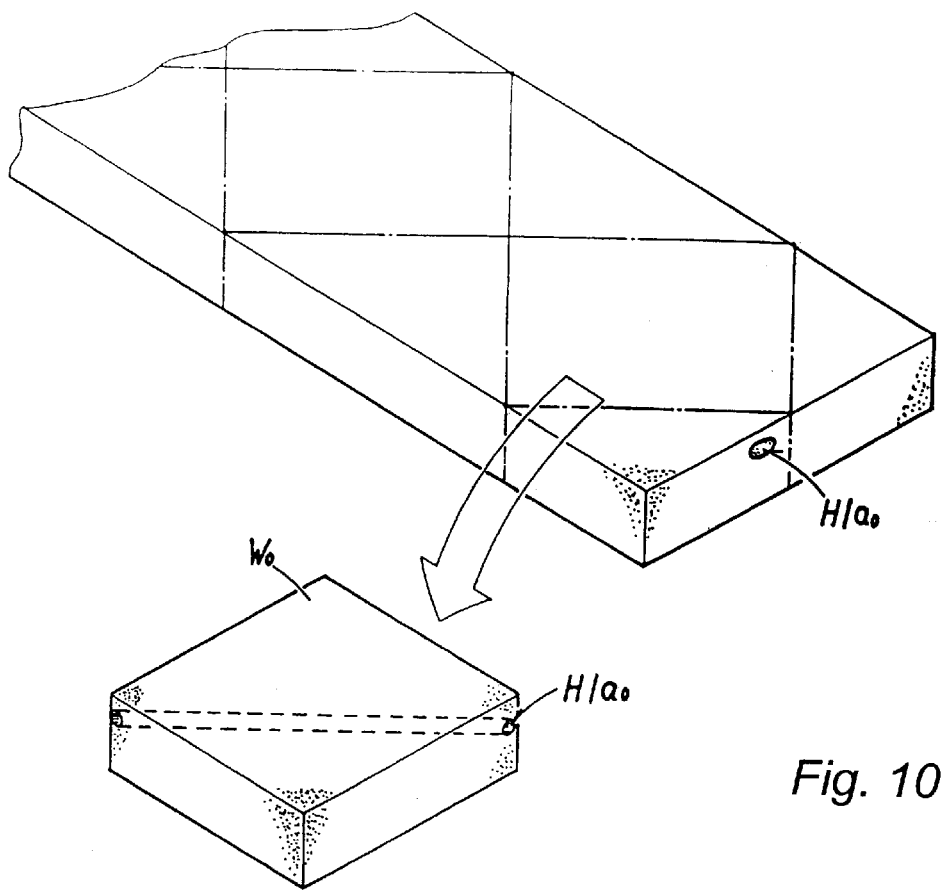
FIG. 10 is a perspective view of the formation of a billet with a diagonal long hole.
Figure 11:
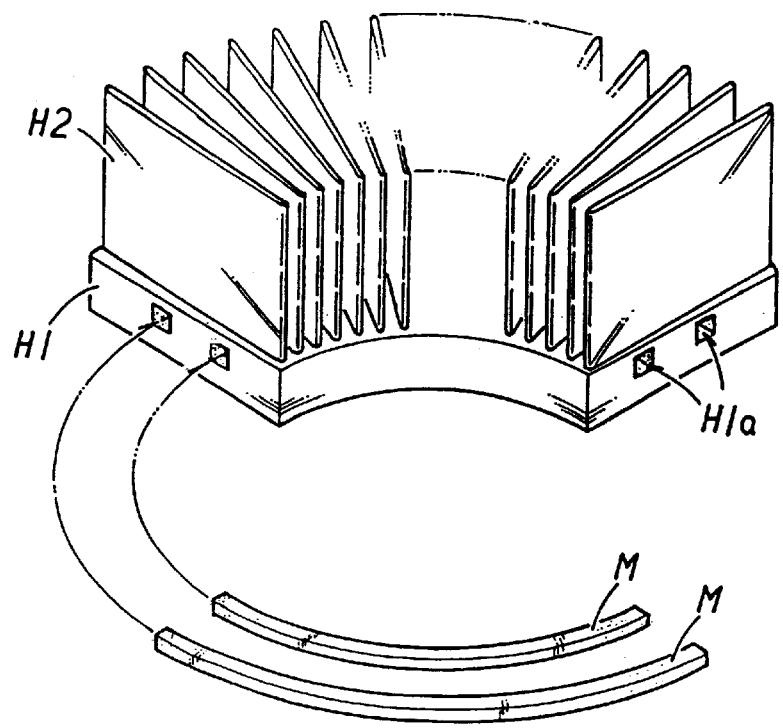
FIG. 11 is a perspective view of another embodiment of a heat exchange unit with curved long holes and mandrels.

The directions of the original long holes H1$a_0$ may be determined by the direction of the cuts made on the extrusion as illustrated in FIG. 10. Through this orientation, the heat pipe can be extended vis-à-vis the shape of the billet $W_0$ to increase the effect of the heat pipe. In FIG. 11 other shapes are contemplated where the billet or ultimate working piece are formed in a curved section. The billet may be curved and then receive curved mandrels.

Thus, heat exchange units are contemplated with efficient use of heat pipes which may be made with a versatile forming method. While embodiments and applications of this invention have been shown and described, it would be apparent to those skilled in the art that many more modifications are possible without departing from the inventive concepts herein. The invention, therefore is not to be restricted except in the spirit of the appended claims.

What is claimed is:

1. A method of forming a heat exchange unit, comprising forming at least one long hole through a metal billet;

inserting at least one mandrel into each of the at least one long hole;

forming a base plate and heat dissipating protrusions extending from the base plate from the metal billet with the at least one long hole and the at least one mandrel in each of the at least one long hole through plastic deformation of the metal billet, the base plate containing the at least one long hole;

removing the at least one mandrel from the at least one long hole after forming the base plate.

2. The method of claim 1 further comprising heating the base plate before removing the at least one mandrel from each of the at least one long hole.

3. The method of claim 2 further comprising deforming the base plate to compress each of the at least one long hole against each of the at least one heat pipe.

4. The method of claim 1, the forming at least one long hole through a metal billet being by extrusion of the billet and the at least one long hole.

5. The method of claim 1 further comprising inserting at least one heat pipe into the at least one long hole after removing the at least one mandrel from the respective at least one long hole.

* * * * *

UNITED STATES PATENT AND TRADEMARK OFFICE
CERTIFICATE OF CORRECTION

PATENT NO. : 6,195,893 B1
DATED : March 6, 2001
INVENTOR(S) : Kataoka, Tetsuji

It is certified that error appears in the above-identified patent and that said Letters Patent is hereby corrected as shown below:

<u>Claim 3, column 6,</u>
Line 36, delete "2" and insert therefor -- 5 --.

Signed and Sealed this

Second Day of October, 2001

Attest:

*Nicholas P. Godici*

NICHOLAS P. GODICI
*Attesting Officer*  *Acting Director of the United States Patent and Trademark Office*